United States Patent
Tsai et al.

(10) Patent No.: US 9,141,742 B2
(45) Date of Patent: Sep. 22, 2015

(54) PRIORI CORNER AND MODE REDUCTION

(71) Applicant: Synopsys, Inc., Mountain View, CA (US)

(72) Inventors: Jeng-Liang Tsai, San Jose, CA (US); Pei-Hsin Ho, Portland, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/139,568

(22) Filed: Dec. 23, 2013

(65) Prior Publication Data

US 2014/0189634 A1    Jul. 3, 2014

Related U.S. Application Data

(60) Provisional application No. 61/747,973, filed on Dec. 31, 2012.

(51) Int. Cl.
*G06F 17/50*    (2006.01)

(52) U.S. Cl.
CPC .................... *G06F 17/505* (2013.01)

(58) Field of Classification Search
CPC ................ G06F 17/30; G06F 17/50
USPC .......... 716/134; 257/691, 686, 698, 723, 774, 257/777, E23.011, E23.174
See application file for complete search history.

(56) References Cited

U.S. PATENT DOCUMENTS

| | | | |
|---|---|---|---|
| 2006/0080627 A1 * | 4/2006 | Murgai et al. ..................... | 716/6 |
| 2010/0095259 A1 * | 4/2010 | Tetelbaum ....................... | 716/6 |
| 2010/0115477 A1 | 5/2010 | Albrecht et al. | |
| 2010/0169846 A1 | 7/2010 | Gupta et al. | |
| 2011/0078639 A1 | 3/2011 | Lin et al. | |
| 2011/0209113 A1 | 8/2011 | Rahmat et al. | |
| 2011/0231811 A1 | 9/2011 | Tang et al. | |
| 2013/0326459 A1 * | 12/2013 | Bickford et al. .............. | 716/133 |

\* cited by examiner

*Primary Examiner* — Mohammed Alam
(74) *Attorney, Agent, or Firm* — Park, Vaughan, Fleming & Dowler LLP; Laxman Sahasrabuddhe

(57) ABSTRACT

Systems and techniques are described for performing a priori corner and mode reduction. Some embodiments create a synthetic corner in which (1) a cell delay for each library cell in a set of library cells corresponds to a maximum delay over multiple temperature corners, and/or (2) a cell delay for each library cell in a set of library cells corresponds to a maximum delay over multiple parasitic corners. Some embodiments can identifying, for a given corner, a portion of the circuit design that is common across multiple modes, and then replace the multiple modes with a single mode for optimizing and verifying timing constraints of the portion of the circuit design that is common across the multiple modes. The circuit design can then be optimized over the reduced set of modes and/or corners.

6 Claims, 2 Drawing Sheets

---

Identify, for a given corner, a portion of the circuit design that is common across multiple modes
202

↓

Replace the multiple modes with a single mode for optimizing the portion of the circuit design that is common across the multiple modes, wherein the single mode captures all timing requirements across the multiple modes
204

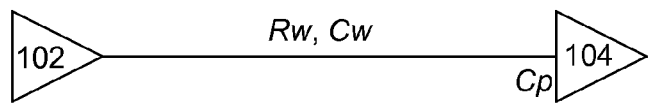

FIG. 1

Identify, for a given corner, a portion of the circuit design that is common across multiple modes
202

Replace the multiple modes with a single mode for optimizing the portion of the circuit design that is common across the multiple modes, wherein the single mode captures all timing requirements across the multiple modes
204

FIG. 2A

Receive a set of library cells
222

Create a synthetic corner in which a cell delay for each library cell in the set of library cells corresponds to a maximum delay over multiple temperature corners
224

Optimize a circuit design using the synthetic corner
226

FIG. 2B

PRIORI CORNER AND MODE REDUCTION

RELATED APPLICATION

This application claims priority to U.S. Provisional Patent Application No. 61/747,973, entitled "Multi-corner multi-mode (MCMM) scenario reduction," by the same inventors, filed on 31 Dec. 2012, the contents of which are herein incorporated by reference in their entirety for all purposes.

BACKGROUND

1. Technical Field

This disclosure generally relates to reducing the number of corner and mode combinations over which a circuit design needs to be optimized. More specifically, this disclosure relates to a priori corner and mode reduction.

2. Related Art

Rapid advances in computing technology have made it possible to perform trillions of computational operations each second on data sets that are sometimes as large as trillions of bytes. These advances can be largely attributed to the exponential increase in the size and complexity of integrated circuits.

To ensure that a manufactured chip will perform as desired, the circuit design is usually checked for compliance with a large number of design requirements. In fact, a circuit design is typically not manufactured until it satisfies the design requirements which can include, but are not limited to, timing requirements, noise requirements, leakage requirements, etc.

In a typical circuit design flow, a compliance checking tool is used to identify design requirement violations in a circuit design. Incremental adjustments are then made to the circuit design to fix the design requirement violations. Once the circuit design is violation free, the circuit design can be readied for manufacturing.

The advance to smaller semiconductor geometries has increased the variability in process and operating conditions of integrated circuits. A process corner is a particular set of process conditions under which the circuit design may be manufactured. An operating corner is a particular set of operating conditions (e.g., temperature, voltage) under which the circuit design may operate.

Modern circuit designs typically have multiple operating modes (e.g., stand-by, mission, test, etc.). Specifically, some parts of the circuit design may be completely switched off in certain operating modes. Further, different operating modes can have drastically different voltages, clock speeds, etc.

It is desirable to ensure that a circuit design meets the functional and performance goals under all combinations of process corners, operating conditions, and/or operating modes. The term "Multi-Corner/Multi-Mode (MCMM) scenario," or "scenario" for short, refers to a combination of a particular process corner, a particular operating condition, and/or a particular operating mode.

The amount of time required to fix design requirement violations is increasing rapidly because the size and complexity of circuit designs is increasing rapidly and because the number of scenarios over which circuit designs need to be checked is increasing rapidly.

SUMMARY

Systems and techniques are described for performing a priori corner and mode reduction. After the number of modes and/or corners has been reduced, the circuit design can then be optimized over only the reduced set of modes and/or corners, thereby significantly improving runtime performance.

Specifically, some embodiments receive a set of library cells. Next, the embodiments can create a synthetic corner in which a cell delay for each library cell in the set of library cells corresponds to a maximum delay over multiple temperature corners. The embodiments can then optimize a circuit design using the synthetic corner.

In some embodiments, a synthetic corner can be created in which a cell delay for each library cell in the set of library cells corresponds to a maximum delay over multiple parasitic corners. The embodiments can then optimize a circuit design using the synthetic corner.

Some embodiments can identify, for a given corner, a portion of the circuit design that is common across multiple modes. Then, the multiple modes can be replaced with a single mode, and the portion of the circuit design can be optimized only for the single mode. Note that timing information for the portion of the design is computed and checked against the constraints in only the single mode (as opposed to being computed and checked in each of the multiple modes).

BRIEF DESCRIPTION OF THE FIGURES

FIG. 1 illustrates how a net delay can be synthesized for a two-pin net in accordance with some embodiments described herein.

FIG. 2A illustrates a process for performing a priori mode reduction in accordance with some embodiments described herein.

FIG. 2B illustrates a process for performing a priori corner reduction in accordance with some embodiments described herein.

DETAILED DESCRIPTION

Figure 2C:
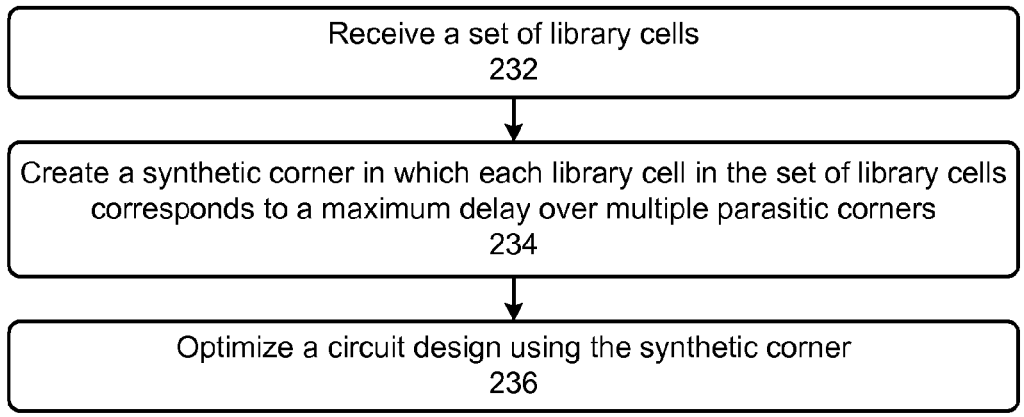
FIG. 2C illustrates a process for performing a priori corner reduction in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z. Additionally, in this disclosure, the term "based on" means "based solely or partially on."

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

A Priori Corner and Mode Reduction

In a place and route design flow, the runtime of pre-route optimization is extremely important. This is because designers usually perform pre-route optimization multiple times to identify timing issues in the design and make design modifications accordingly, and then move on to next stage only after satisfactory timing has been achieved in the pre-route stage.

Designs from 65 nm and below all have to be optimized over multiple corner and mode combinations and the number of active scenarios (active corner/mode combinations) typically dictates the optimization runtime. If the number of active scenarios can be reduced without loss of quality of results (QoR), it will greatly improve the optimization runtime and the total turn-around-time (TAT) for customers.

From 65 nm onwards, designs are usually timed at both high and low temperatures at a given operating voltage to capture temperature inversion effect. Normally, logic gates switch slower at higher temperatures. Temperature inversion is a phenomenon where some logic gates (especially high voltage threshold (HVT) cells under low supply voltage) can switch slower at a low temperature than at a high temperature. Due to temperature inversion effect, the worst negative slack (WNS) may be worse at a low temperature than at a high temperature. Therefore, an optimization engine cannot guarantee to improve WNS without looking at both high and low temperature corners. One approach to ensure that an optimization engine captures this effect is to consider a pair of corners (for the same process and voltage parameters). However, this can significantly slow down pre-route optimization (because the optimization has to be performed over twice as many scenarios).

Some embodiments described in this disclosure can capture the temperature inversion effect without increasing the optimization run time. Specifically, a synthetic corner capability is described in this disclosure to capture temperature inversion effect without the need to activate two corners. In some embodiments, the optimization tool analyzes and predicts which types of gates are expected to switch slower at a low temperature in the final optimized design. The optimization tool can then activate only the high temperature corner, but instruct the timer to calculate cell delays for those gate types that are expected to exhibit temperature inversion using low temperature delay tables. This allows the optimization tool to achieve a significant runtime gain while still being able to model the temperature inversion effect, thus achieving a QoR that is similar to the QoR that would have been achieved if both the high temperature corner and the low temperature corner had been activated.

The runtime of an MCMM optimization engine is proportional to the number of active scenarios that determines the amount of timing update computation. Carefully managing the number of active scenarios will direct impact the runtime of an MCMM optimization engine.

Some conventional techniques use dominant scenarios to reduce the number of MCMM scenarios. In these techniques, a subset of scenarios is identified based on timing analysis. The scenarios in this subset are called dominant scenarios, and these scenarios are more timing critical than other scenarios. MCMM optimization is then performed over only this subset of scenarios. The MCMM optimization engine is able to capture most timing violations by activating only the dominant scenarios. In some of these approaches, a timing update is performed for all scenarios, endpoint violations are analyzed, and a binate covering problem is constructed to identify the dominant scenarios, which are then used for optimization. The advantage of this approach is that the approach does not depend on specific timer features (except for an API to get endpoint violation information efficiently). However, this approach also has a few drawbacks. First, each dominant scenario analysis requires a full timing update for all scenarios. Second, the dominant scenario set may change as optimization progresses (in fact, in some implementations, the dominant scenario set has to be updated twice, and therefore, these approaches can require three full timing updates for all scenarios). Third, the dominant scenario set may still contain too many scenarios (in one implementation of this approach, some scenarios can be periodically deactivated to save more runtime, but this can potentially create convergence problem). Fourth, some implementations of this approach can only handle one setup scenario at a time. Therefore, an optimization solution needs to be timed in all activated scenarios (potentially with different modes) to capture design changes that improve timing in one scenario but degrade timing in another scenario. This can lead to high rejection rate and runtime.

To summarize, these techniques adopt a "dynamic" timing analysis approach to identify dominant scenarios, which requires a full timing update and the analysis has to be performed multiple times. Coupled with the infrastructure limitation in some of the implementations that can look at only one setup scenario, many solutions generated by these approaches can get rejected and the work wasted, leading to long runtime.

In contrast to such "dynamic" techniques, some embodiments described herein use a "static" analysis approach to reduce number of active corners/modes. If the timing tool already separates corner and mode, it is natural to decompose the scenario reduction problem into two orthogonal problems, corner reduction and mode reduction. If modes are carefully created with no redundancy, all modes (e.g. functional and test modes) will likely need to be considered simultaneously and there is less opportunity for mode reduction. It does not mean mode reduction is not possible. For example, if a large chunk of the logic has the same boundary timing across multiple modes for a given corner, the delay calculation for the common logic may be shared.

Most data paths are cell delay dominant, and cell delay is affected by process (P) variations, voltage (V) variations, temperature (T) variations, as well as the input slew and the output load. It is easy to identify which corners have the slowest process (P) and lowest voltage (V). If multiple corners have the same (P, V) values, a cell will be slower in the corner with the largest wire capacitance due to the larger output load. Therefore, it is easy to narrow down the corners that are critical for setup optimization to a pair of corners that are identical in P and V but differ in T, for the temperature inversion effect mentioned before.

Note that the "static" corner analysis described herein is very fast because it does not rely on a full timing update. Also, the result does not change as the optimization progresses. The ultimate goal of corner reduction is one-corner-per-mode. This can be achieved if temperature inversion effect can be captured without activating the low temperature corner. In static timing analysis (STA), it is a common technique to apply a "MAX" operation (this operation computes the maximum value from a given set of values) to solve the complexity and runtime problem. For example, STA usually takes the max transition from all cell arcs at an output pin, and propagates the maximum value forward. This results in some pessimism but is a commonly accepted approach due to its runtime advantage. Similarly, some embodiments described herein "create" a synthetic corner, in which the cell delay of any cell instance is the max cell delay across high and low temperature corners. Some embodiments then perform setup optimization using the synthetic corner, where critical paths from both corners will be seen by these embodiments.

Note that there may not be any runtime gain if the timer has to calculate the cell delays from both corners (i.e., high and low temperature corners) to find out the max delay of the two. Therefore, some embodiments pre-characterize the technology parameters to determine the nominal input transition and output load of each gate type, and determine whether the max gate delay will occur at high or low temperature. The timer can then use this information to realize a synthetic corner, where gate delays are (approximately) the worst from two corners.

With the synthetic corner support from timer, some embodiments are able to perform setup optimization in a one-synthetic corner-per-mode setting. Some embodiments then look at all timing numbers from those corner/mode combinations simultaneously during optimization to avoid the solution rejection and convergence issues seen in some conventional approaches.

While performing pre-route optimization, if chemical-mechanical polishing (CMP) variation is a concern, then multiple corners can be created that differ only in the resistance and capacitance values that are generated for nets. Usually, the same cell library will be paired with a maximum capacitance model and a maximum resistance model to form two corners, which are hereinafter referred to as the "maximum parasitic capacitance corner" and the "maximum parasitic resistance corner," respectively. Since data paths are usually cell-delay dominant, most paths will have larger path delay in the maximum parasitic capacitance corner due to larger load seen by cells. However, paths containing long wires may have worse path delays in the maximum parasitic resistance corner due to larger RC delay.

To achieve the best pre-route optimization runtime, optimization in some embodiments aims to activate only one corner per mode. However, without activating the maximum parasitic resistance corner, some embodiments would not be able to identify and buffer the long wires that could create timing or transition issues in the maximum parasitic resistance corner. Therefore, some embodiments feature a synthetic net delay capability to capture the timing impact from both the maximum parasitic capacitance and resistance corners without the need to activate two corners. Specifically, some embodiments determine which corners correspond to the same process, voltage, and temperature values, but have different parasitic corners. The embodiments then activate only one of the corners, but instruct the net estimation engine to look at net delays and capacitances in all corners. The net estimation engine then generates synthesized net delays and capacitances for the active corner from data collected across corners. For example, the net estimation engine may present to the timer a net capacitance from the maximum parasitic corner and a net delay from the larger of the two in both the maximum parasitic capacitance and resistance corners.

To capture the timing effect from multiple parasitic corners without introducing too much timing pessimism, the net estimation engine may synthesize a net delay or a net capacitance that is not equal to the values in either the maximum parasitic resistance or capacitance corners. However, while synthesizing the net delay, care must be taken so that the assumptions that the timer currently has on net delay are not violated. For example, if the timer assumes that a net delay would not change when its driver is sized, then this assumption must not be violated when synthesizing the net delay.

An example of how the net delay can be synthesized is now described. In different parasitic corners, the resistance and capacitance values usually vary in opposite directions (i.e., when the resistance increases from a first corner to a second corner, then the capacitance usually decreases, and vice versa). For example, when wire thickness or width is reduced due to dishing or erosion from CMP, resistance will increase while capacitance will decrease due to reduced wire surface area.

In the virtual routing stage, one can roughly assume that if a wire has resistance Rw and capacitance Cw in the maximum parasitic capacitance corner, then the same wire will have resistance kr×Rw and capacitance kc×Cw in the maximum parasitic resistance corner, where kr>1 and kc<1 are coefficients that can be selected depending on the circuit design and/or technology. In some circuit designs, kr was roughly equal to 4 while kc was roughly equal to 0.5.

FIG. 1 illustrates how a net delay can be synthesized for a two-pin net in accordance with some embodiments described herein. An output of gate 102 is electrically connected to an input of gate 104 (gates 102 and 104 can generally be any logic gates). Without loss of generality, let Rw and Cw be the resistance and capacitance values for the wire in the maximum parasitic capacitance corner, and let Cp be the pin load at the end of the wire, e.g., let Cp be the input capacitance of gate 104.

Let $D(C_{tot})$ be the driver delay when it drives a load of $C_{tot}$. The stage (driver and net) delay in the maximum parasitic capacitance corner can be approximated as follows:

$$SD_{maxC} = D(Cw+Cp) + Rw \cdot (0.5 \cdot Cw+Cp) - D(D_{tot1}) + ND_1, \quad (1)$$

where the subscript "maxC" refers to the maximum parasitic capacitance corner, capacitance $C_{tot1}$ is equal to Cw+Cp, and $ND_1$ is the net delay (Cw is multiplied by 0.5 in the above equation because the total wire capacitance Cw can be approximated as two lumped capacitances of 0.5×Cw at the two ends of the wire).

Likewise, the stage delay in the maximum parasitic resistance corner can be approximated as follows:

$$SD_{maxR} = D(kc \cdot Cw + Cp) + kr \cdot Rw \cdot (0.5 \cdot kc \cdot Cw + Cp) = D(C_{tot2}) + ND_2, \quad (2)$$

where the subscript "maxR" refers to the maximum parasitic resistance corner, capacitance $C_{tot2}$ is equal to kc×Cw+Cp, and $ND_2$ is the net delay.

The net estimation engine can control the stage delay by providing the appropriate $C_{synth}$ and $ND_{synth}$ values to the timer (e.g., the piece of software that computes timing in the circuit design) so that the timer computes the stage delay as $SD_{synth} = D(C_{synth}) + ND_{synth}$.

For example, in some embodiments, the net estimation engine can synthesize $C_{synth}$ and $ND_{synth}$ as follows: $C_{synth} = \max(C_{tot1}, C_{tot2})$ and $ND_{synth} = \max(ND_1, ND_2)$. Note that, when kr×kc>1, this strategy is equivalent to $C_{synth} = C_{tot1}$ and $ND_{synth} = ND_2$. However, this will lead to a stage delay that is greater than the stage delay in either of the two corners, i.e., $SD_{synth} > \max(SD_{maxC}, SD_{maxR})$. In other embodiments that are less pessimistic, the net estimation engine provides $C_{synth}$ and $ND_{synth}$ values so that $SD_{synth} = \max(SD_{maxC}, SD_{maxR})$.

Process for Performing a Priori Corner and Mode Reduction

FIG. 2A illustrates a process for performing a priori mode reduction in accordance with some embodiments described herein. The process can begin by identifying, for a given corner, a portion of the circuit design that is common across multiple modes (operation 202). Next, the process can replace the multiple modes with a single mode for optimizing the portion of the circuit design that is common across the multiple modes, wherein the single mode captures all timing requirements across the multiple modes (operation 204). Recall that different portions of the circuit design may be "switched off" or deactivated in different modes. However, it is possible that a portion of the circuit design is active in multiple modes. If so, the multiple modes can be replaced by a single mode as far as the common portion of the circuit design is concerned, thereby enabling the common portion of the circuit design to be optimized (which involves computing the timing information and checking if all timing constraints are satisfied) across all modes at once. Note that the single mode captures all timing constraints across all of the multiple modes. Therefore, the embodiments only have to verify timing for the optimized circuit design once in the single mode instead of verifying timing constraints in all of the modes separately. This saving in the timing computation can significantly speed up the runtime for the optimization process.

Of course the "mode merging" described above can only be performed for a given corner. For example, if the circuit design needs to be optimized over modes M1 and M2 for corner C1 (i.e., over scenarios (M1, C1) and (M2, C1)), and if logic L is common to modes M1 and M2, then logic L can be optimized and the timing constraints can be checked only once for corner C1, instead of requiring the timing constraints to be computed and checked separately for scenarios (M1, C1) and (M2, C1). However, a similar type of mode reduction cannot be performed between modes for two different corners, e.g., between scenarios (M1, C1) and (M2, C2).

FIG. 2B illustrates a process for performing a priori corner reduction in accordance with some embodiments described herein. The process can begin by receiving a set of library cells (operation 222). Next, the process can create a synthetic corner in which a cell delay for each library cell in the set of library cells corresponds to a maximum delay over multiple temperature corners (operation 224). The process can then optimize a circuit design using the synthetic corner (operation 226).

FIG. 2C illustrates a process for performing a priori corner reduction in accordance with some embodiments described herein. The process can begin by receiving a set of library cells (operation 232). Next, the process can create a synthetic corner in which each library cell in the set of library cells corresponds to a maximum delay over multiple parasitic corners (operation 234). The process can then optimize a circuit design using the synthetic corner (operation 236).

In some embodiments, the above-described corner and mode reductions can be combined. For example, in some embodiments the process can perform one or more of the following operations: operations 202, 224, and 234. Specifically, in some embodiments, the process can create a synthetic corner in which each library cell in a set of library cells is associated with a maximum delay over multiple combinations of temperatures and parasitic corners. Next, for a given synthetic corner, the process can merge modes that share common logic. Once the modes and/or corners have been reduced, the process can perform optimization using the merged modes and/or synthetic corners.

Computer System

Figure 3:
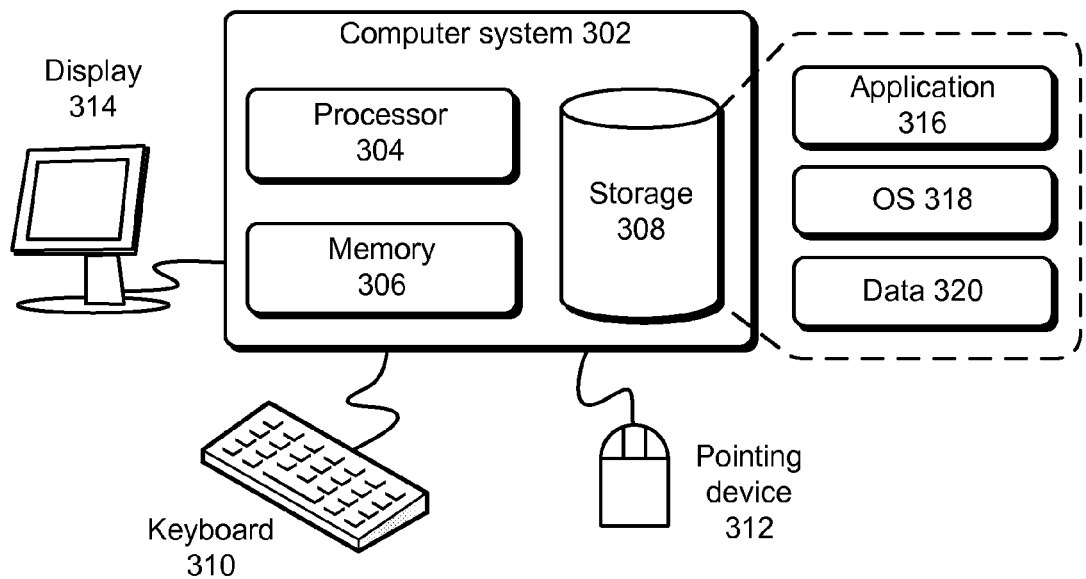
FIG. 3 illustrates a computer system in accordance with some embodiments described herein.

FIG. 3 illustrates a computer system in accordance with some embodiments described herein. A computer or a computer system can generally be any system that can perform computations. Specifically, a computer system can be a microprocessor, an application specific integrated circuit, a distributed computing system, a cloud computing system, or any other computing system now known or later developed. Computer system 302 comprises processor 304, memory 306, and storage 308. Computer system 302 can be coupled with display 314, keyboard 310, and pointing device 312. Storage 308 can generally be any device that can store data. Specifically, a storage device can be a magnetic, an optical, or a magneto-optical storage device, or it can be based on flash memory and/or battery-backed up memory. Storage 308 can store application 316, operating system 318, and data 320.

Application 316 can include instructions that when executed by computer 302 cause computer 302 to perform one or more processes that are implicitly or explicitly described in this disclosure. Data 320 can include any data that is inputted into or outputted by application 316.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool in a computer, a method for performing a priori corner and mode reduction based on a set of library cells, wherein the set of library cells includes delay information for each cell for a plurality of corners and a plurality of modes, wherein different modes correspond to different portions of a circuit design in which timing constraints need to be satisfied, the method comprising:

identifying, by the EDA tool in the computer, for at least one corner, a portion of the circuit design that is common across a set of modes;

replacing, by the EDA tool in the computer, the set of modes with a single mode for optimizing the portion of the circuit design that is common across the set of modes;

creating, by the EDA tool in the computer, a synthetic corner in which a cell delay for each library cell in the set of library cells corresponds to a maximum delay over multiple temperature corners; and optimizing, by the EDA tool in the computer, the circuit design using the synthetic corner.

2. The method of claim 1, wherein the cell delay in the synthetic corner is equal to a cell delay in a high temperature corner when temperature inversion does not occur, and wherein the cell delay in the synthetic corner is equal to a cell delay in a low temperature corner when temperature inversion occurs.

3. A non-transitory computer-readable storage medium storing instructions for an electronic design automation (EDA) tool that, when executed by a computer, cause the computer to perform a method for performing a priori corner and mode reduction based on a set of library cells, wherein the set of library cells includes delay information for each cell for a plurality of corners and a plurality of modes, wherein different modes correspond to different portions of a circuit design in which timing constraints need to be satisfied, the method comprising:

identifying, for at least one corner, a portion of the circuit design that is common across a set of modes;

replacing the set of modes with a single mode for optimizing the portion of the circuit design that is common across the set of modes;

creating a synthetic corner in which a cell delay for each library cell in the set of library cells corresponds to a maximum delay over multiple temperature corners; and optimizing the circuit design using the synthetic corner.

4. The non-transitory computer-readable storage medium of claim 3, wherein the cell delay in the synthetic corner is equal to a cell delay in a high temperature corner when temperature inversion does not occur, and wherein the cell delay in the synthetic corner is equal to a cell delay in a low temperature corner when temperature inversion occurs.

5. An apparatus, comprising:

a processor; and a non-transitory computer-readable storage medium storing instructions for an electronic design automation (EDA) tool that, when executed by the processor, cause the apparatus to perform a method for performing a priori corner and mode reduction based on a set of library cells, wherein the set of library cells includes delay information for each cell for a plurality of corners and a plurality of modes, wherein different modes correspond to different portions of a circuit design in which timing constraints need to be satisfied, the method comprising:

identifying, for at least one corner, a portion of the circuit design that is common across a set of modes;

replacing the set of modes with a single mode for optimizing the portion of the circuit design that is common across the set of modes;

creating a synthetic corner in which a cell delay for each library cell in the set of library cells corresponds to a maximum delay over multiple temperature corners; and optimizing the circuit design using the synthetic corner.

6. The apparatus of claim 5, wherein the cell delay in the synthetic corner is equal to a cell delay in a high temperature corner when temperature inversion does not occur, and wherein the cell delay in the synthetic corner is equal to a cell delay in a low temperature corner when temperature inversion occurs.

* * * * *

UNITED STATES PATENT AND TRADEMARK OFFICE
CERTIFICATE OF CORRECTION

| | | |
|---|---|---|
| PATENT NO. | : 9,141,742 B2 | Page 1 of 1 |
| APPLICATION NO. | : 14/139568 | |
| DATED | : September 22, 2015 | |
| INVENTOR(S) | : Jeng-Liang Tsai et al. | |

It is certified that error appears in the above-identified patent and that said Letters Patent is hereby corrected as shown below:

Title Page

In item 54 please delete the word, "PRIORI" from the invention title and replace it with the phrase --A PRIORI-- so that the title reads as follows:

--A PRIORI CORNER AND MODE REDUCTION--

Signed and Sealed this
Ninth Day of February, 2016

Michelle K. Lee
*Director of the United States Patent and Trademark Office*